United States Patent [19]
Atsumi et al.

[11] Patent Number: 4,574,273
[45] Date of Patent: Mar. 4, 1986

[54] CIRCUIT FOR CHANGING THE VOLTAGE LEVEL OF BINARY SIGNALS

[75] Inventors: Shigeru Atsumi; Sumio Tanaka, both of Tokyo, Japan

[73] Assignee: Tokyo Shibaura Denki Kabushiki Kaisha, Japan

[21] Appl. No.: 548,783

[22] Filed: Nov. 4, 1983

[30] Foreign Application Priority Data

Nov. 12, 1982 [JP] Japan ................... 57-198596

[51] Int. Cl.[4] .................. H03K 17/10; H03K 19/094
[52] U.S. Cl. ..................... 307/475; 307/443; 307/451; 307/579; 307/585
[58] Field of Search ............... 307/443, 448, 451, 475, 307/264, 270, 548, 550, 568, 575, 579, 584, 585

[56] References Cited

U.S. PATENT DOCUMENTS

| | | | |
|---|---|---|---|
| 3,675,144 | 7/1972 | Zuk | 307/475 X |
| 3,728,556 | 4/1973 | Arnell | 307/475 |
| 4,216,390 | 8/1980 | Stewart | 307/264 |
| 4,490,633 | 12/1984 | Noufer et al. | 307/475 |
| 4,506,164 | 3/1985 | Higuchi | 307/475 X |

OTHER PUBLICATIONS

Miyasaka et al., "A 150 ns CMOS 64K EPROM Using N-Well Technology," ISSCC Digest of Technical Papers pp. 182-183, Feb. 1982.

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

A voltage converter circuit has an input terminal for receiving an input binary signal and a gate for generating an output binary signal corresponding to the input binary signal. An output signal from the gate is supplied to a first input terminal of an inverter through a transistor and further to a second input terminal of the inverter directly, so as to immediately stabilize the output signal from the voltage converter circuit. The inverter inverts the input signal to a higher-voltage binary signal. When a voltage level of the higher-voltage binary signal reaches a given voltage level while the voltage level of the higher-voltage binary signal changes, a feedback circuit is operated to set the input signal supplied to the first input terminal of the inverter at a higher voltage.

3 Claims, 2 Drawing Figures

F I G. 2
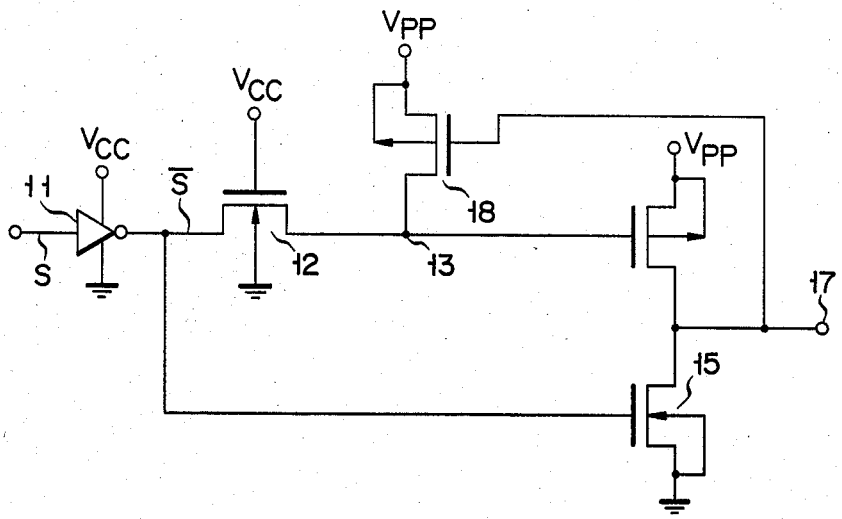

CIRCUIT FOR CHANGING THE VOLTAGE LEVEL OF BINARY SIGNALS

BACKGROUND OF THE INVENTION

The present invention relates to a voltage converter circuit and, more particularly, to a voltage converter circuit for converting a binary signal to a higher-voltage binary signal.

In a nonvolatile semiconductor memory comprising MOS transistors as memory cells each having a floating gate, a voltage higher than a normal data read voltage is used to write data. For example, the data read voltage is +5 V, the data write voltage is about +20 V.

The data write signal is obtained by voltage-converting the read signal.

FIG. 1 shows a circuit which is obtained by modifying a circuit of FIG. 4 in "ISSCC DIGEST OF TECHNICAL PAPERS", Febuary 1982, p. 183 so as to obtain a higher-voltage binary signal. The word "higher-voltage binary signal" means a signal in which a voltage corresponding to logic "0" is the same as that corresponding to logic "0" of the input binary signal and a voltage corresponding to logic "1" is higher than that corresponding to logic "1" of the input binary signal. In this example, a voltage corresponding to logic "1" of the input binary signal is set at e.g., 5 V, a voltage corresponding to logic "1" of the higher-voltage binary signal is set at e.g., 21 V, and a voltage corresponding to logic "0" is commonly set at e.g., 0 V for the input binary signal and the higher-voltage binary signal.

Referring to FIG. 1, a voltage Vcc is a power supply voltage for data read and is set at a voltage of +5 V. A voltage Vpp is a power supply voltage for data write and is set at +21 V. As shown in FIG. 1, a binary signal S is supplied to an inverter 11 to which the power supply voltage Vcc is supplied. When the binary signal S is set at logic "0" (ground level, i.e., 0 V), its inverted signal $\bar{S}$ is set at logic "1" (voltage Vcc).

The signal $\bar{S}$ is supplied to the source of an n-channel MOS transistor 12 having a gate to which the power supply voltage Vcc is normally applied. A circuit point 13 to which the drain of the MOS transistor 12 is connected is set at a voltage (Vcc-Vth) obtained by subtracting a threshold voltage Vth of the MOS transistor 12 from the power supply voltage Vcc. The voltage at the circuit point 13 is applied to a CMOS inverter 16 which receives the power supply voltage Vpp and which comprises a p-channel MOS transistor 14 and an n-channel MOS transistor 15. If the threshold voltage of the CMOS inverter 16 is designed to be lower than the voltage (Vcc-Vth), a voltage at a voltage output terminal 17 connected to the output terminal of the CMOS inverter 16 decreases to 0 V. In this case, a p-channel MOS transistor 18 which is inserted between a terminal which is supplied with the power supply voltage Vpp and the circuit point 13 and which receives at its gate the voltage at the voltage output terminal 17 is turned on, so that the voltage at the circuit point 13 is increased. When the voltage at the circuit point 13 exceeds the voltage (Vcc-Vth), the transistor 12 is turned off and the voltage at the circuit point 13 increases to the voltage Vpp. The voltage Vpp is then applied to the gate of the p-channel MOS transistor 14 in the CMOS inverter 16, so that the p-channel MOS transistor 14 is turned off. As a result, the voltage at the voltage output terminal 17 comes close to 0 V.

In this state, the binary signal S goes to logic "1". The inverted output signal $\bar{S}$ from the inverter 11 goes to logic "0". The MOS transistor 12 is then turned on, so that the voltage at the circuit point 13 is decreased from the voltage Vpp. When the voltage at the circuit point 13 is decreased to be lower than the threshold voltage of the CMOS inverter 16, the output level of the inverter 16 is inverted, so that the voltage at the voltage output terminal 17 is increased toward the voltage Vpp. The current supply capacity of the MOS transistor 18 is decreased, and the voltage at the circuit point 13 is decreased. As a result, the voltage at the voltage output terminal 17 is finally stabilized at the voltage Vpp.

In order to instantaneously increase the voltage at the voltage output terminal 17 to the voltage Vpp, the voltage at the circuit point 13 must be instantaneously decreased. For this purpose, the conductance of the MOS transistor 12 must be sufficiently greater than that of the MOS transistor 18.

According to the circuit shown in FIG. 1, a higher-voltage binary signal can be obtained from the input binary signal S.

In the conventional circuit shown in FIG. 1, the voltage at the circuit point 13 is increased up to the voltage (Vcc-Vth) immediately after the binary signal S is inverted from logic "1" to logic "0". The driving capacity of the n-channel MOS transistor 15 is not sufficient as compared with the case wherein the power supply voltage Vcc is directly supplied to the gate thereof. As a result, time for setting the voltage at the voltage output terminal 17 to be 0 V becomes prolonged, resulting in inconvenience. This becomes significant when the conventional circuit is used under the condition where the power supply voltage Vcc is decreased. In addition to this disadvantage, the voltage at the voltage output terminal 17 is stabilized to be a given value and cannot be set to be completely 0 V if the power supply voltage Vcc is not properly set.

In order to instantaneously decrease the voltage at the circuit point 13 of the conventional circuit, the conductance ratio of the transistor 12 to the transistor 18 must be determined to be a predetermined value or higher. For this reason, the conventional circuit has many design and manufacturing limitations, resulting in inconvenience.

SUMMARY OF THE INVENTION

The present invention has been made in consideration of the above situation, and has for its object to provide a voltage converter circuit wherein a ground level voltage (0 V) of a higher-voltage binary signal can be immediately and stably obtained irrespective of a power supply voltage range, and wherein design and manufacturing limitations can be reduced.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the circuit of this invention comprises input means for receiving an input binary signal; gate means connected to said input means, for generating an output binary signal corresponding to the input binary signal; a first reference terminal to which a high voltage, higher than the high level of said input binary signal, is supplied; a second reference terminal to which a constant voltage lower than the high voltage and equal to or higher than the high level or said input binary signal is supplied; a disconnecting n-channel MOS transistor having a current path with two ends, one end of which is connected to said gate means, and a gate which is connected to said second reference terminal; inverting means, having a first input terminal which is connected to the other end of the current path of said disconnecting n-channel MOS transistor and a second input terminal which is connected to said gate means, for converting the output binary signal of said gate means to a higher-voltage binary signal, said inverting means having an output terminal for providing the converted higher-voltage binary signal; and feedback means, comprising a p-channel MOS transistor having a source connected to the first reference terminal, a drain connected to said first input terminal of said inverting means and a gate connected to said output terminal of said inverting means, for causing the voltage level at said first input terminal of said inverting means to be set at said high voltage when the voltage of the converted higher-voltage binary signal reaches a given voltage level, said disconnecting n-channel MOS transistor electrically isolating said gate means and said second input terminal of said inverting means from the high voltage applied at said first input terminal of said inverting means.

According to the voltage converter circuit of the present invention, the ground level of the output signal from the voltage converter circuit can be instantaneously stabilized without receiving influence by the power supply voltage. Furthermore, design and manufacturing limitations can be reduced. For these reasons, when the voltage converter circuit is used for EPROM write operation, high-speed data write can be performed.

The accompanying drawings, which are incorporated in and constitute a part of this specification illustrate one embodiment of the invention and, together with description, serve to explain the principles of the invention.

BRIEF DESCRIPTION OF THE DRAWINGS

FIG. 2 is a circuit diagram of an embodiment of a voltage converter circuit constructed according to the present invention.

DETAILED DESCRIPTION OF THE PREFERRED EMBODIMENT

Figure 1:
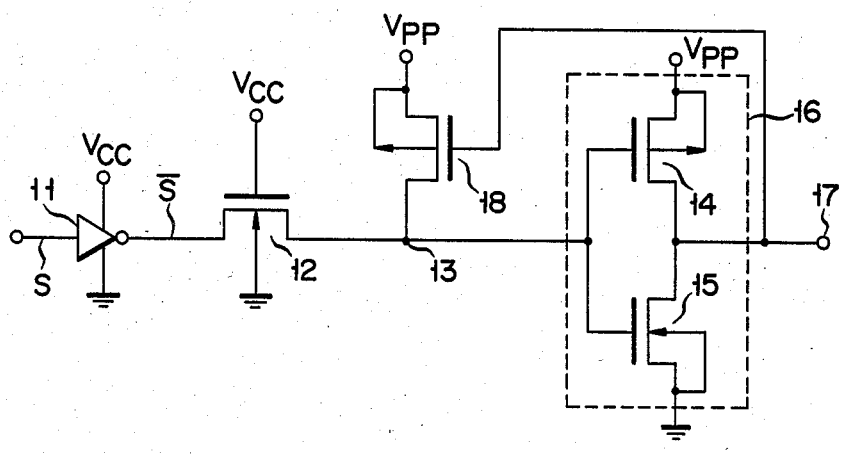
FIG. 1 is a circuit diagram of a conventional voltage converter circuit.

A preferred embodiment of the present invention will be described with reference to the accompanying drawing. The feature of the present invention shown in FIG. 2 is that the gate of an n-channel MOS transistor 15 is connected to the output terminal of an inverter 11 instead of being connected to a circuit point 13. The same reference numerals as used in FIG. 1 denote the same parts in FIG. 2. The voltage converter circuit of the present invention is arranged in the following manner. The source or drain of an n-channel MOS transistor 12 is connected to the output terminal of the inverter 11 to which a binary signal S is supplied. The gate of the transistor 12 is connected to a terminal to which the power supply voltage Vcc is applied. The source of the p-channel MOS transistor 14 is connected to a terminal to which a power supply voltage Vpp is applied, the drain thereof is connected to a voltage output terminal 17, and the gate thereof is connected to circuit point 13 to which the drain or source of the MOS transistor 12 is connected.

The drain of an n-channel MOS transistor 15 is connected to the voltage output terminal 17, the source thereof is connected to a terminal to which a ground level voltage (0 V) is applied, and the gate thereof is connected to the output terminal of the inverter 11. The source of a p-channel MOS transistor 18 is connected to a terminal to which the power supply voltage Vpp is applied, the drain thereof is connected to the circuit point 13, and the gate thereof is connected to the voltage output terminal 17. The back gates of the MOS transistors 12 and 15 are connected to the terminals to which the ground level voltage is applied, respectively. The back gates of the MOS transistors 14 and 18 are connected to the terminals to which the power supply voltage Vpp is applied, respectively.

In the voltage converter circuit of the present invention, when the binary signal S is set at logic "0", i.e., when an inverted signal S̄ is set at logic "1", a voltage at the circuit point 13 is set at a voltage (Vcc −Vth) in the same manner as in the conventional device. In this state, the p-channel MOS transistor 14 is kept ON. Meanwhile, the voltage corresponding to logic "1" (i.e., the voltage Vcc) is directly applied to the gate of the n-channel MOS transistor 15, so that the driving capacity of the MOS transistor 15 is increased by a voltage corresponding to the threshold voltage Vth, as compared with the conventional case. As a result, the MOS transistor 15 is rapidly turned on. The voltage at the voltage output terminal 17 is decreased to 0 V more rapidly than the conventional case. The p-channel MOS transistor 18 is turned on, so that the voltage at the circuit point 13 is increased to the voltage Vpp, and the p-channel MOS transistor 14 is turned off. As a result, the voltage at the voltage output terminal 17 comes close to 0 V. In this manner, when the binary signal S̄ is set at logic "1", the voltage Vcc is applied to the n-channel MOS transistor 15 from the beginning. Therefore, the voltage at the voltage output terminal 17 is rapidly set at 0 V. Even when the power supply voltage Vcc is set at a low voltage, the voltage Vcc is applied to the gate of the n-channel MOS transistor 15. Therefore, the voltage at the voltage output terminal 17 can be stablized to be 0 V for a wider power supply voltage range than the power supply voltage range in the conventional device.

Now assume that the binary signal S goes to logic "1". The inverted signal S̄ goes to logic "0". The MOS transistor 12 is turned on, and the voltage at the circuit point 13 is decreased. When this voltage becomes lower than the threshold voltage of the p-channel MOS transistor 14, the MOS transistor 14 starts to be turned on. Meanwhile, the n-channel MOS transistor 15 is operated at a speed higher than that of the MOS transistor 14. The n-channel MOS transistor 15 is turned off immediately after the signal S̄ goes to logic "0". For this reason, when the MOS transistor 14 starts to be turned on, the voltage at the voltage output terminal 17 is rapidly increased toward the power supply voltage Vpp. The MOS transistor 18 is immediately turned off, thereby decreasing the voltage at the circuit point 13 toward 0 V. In this state, in order to rapidly decrease the voltage at the circuit point 13 and increase the voltage at the voltage output terminal 17, the conductance of the MOS transistor 12 must be greater than that of the MOS transistor 18. However, the MOS transistor 15 is turned off in response to a gate bias of 0 V, so that the MOS transistor 18 is more quickly rendered non-conducting than the conventional device. As a result, high-speed operation can be guaranteed even if the conductances of the MOS transistors 12 and 18 slightly vary.

In this embodiment, the inverter 11 is used as a gate means. However, the gate means is not limited to this arrangement. For example, an AND, NAND, OR or NOR gate whose input terminals are short-circuited or a buffer can be used as the gate means. However, when an AND or OR gate is used, the voltage converter circuit generates a higher-voltage binary signal which is inverted with respect to the input binary signal.

In the above embodiment, p-channel and n-channel MOS transistors are used as an inverting means, a p-channel MOS transistor is used as a feedback means, and an n-channel MOS transistor is used as a disconnecting means. However, the inverting means and the disconnecting means are not limited to these arrangements. For example, the channel types of the MOS transistors can be reversed, or a bipolar transistor can be used.

Furthermore, in the above embodiment, the power supply voltage Vcc is set at about +5 V, and the power supply voltage Vpp is set at about 21 V. However, the voltage values are not limited to these values. The voltage converter circuit can be applied to any circuit arrangement for converting an input binary signal to a higher-voltage binary signal in addition to being applied to the EPROM write circuit arrangement.

What is claimed is:

1. A circuit for changing a signal voltage level, comprising:

input means for receiving an input binary signal;
   gate means, connected to said input means, for generating an output binary signal corresponding to the input binary signal;
   a first reference terminal to which a high voltage, higher than the high level of said input binary signal, is supplied;
   a second reference terminal to which a constant voltage lower than the high voltage and equal to or higher than the high level of said input binary signal is supplied;
   a disconnecting n-channel MOS transistor having a current path with two ends, one end of which is connected to said gate means, and a gate which is connected to said second reference terminal;
   inverting means, having a first input terminal which is connected to the other end of the current path of said disconnecting n-channel MOS transistor and a second input terminal which is connected to said gate means, for converting the output binary signal of said gate means to a higher-volage binary signal, said inverting means having an output terminal for providing the converted higher-voltage binary signal; and
   feedback means, comprising a p-channel MOS transistor having a source connected to the first reference terminal, a drain connected to said first input terminal of said inverting means, and a gate connected to said output terminal of said inverting means, for causing the voltage level at said first input terminal of said inverting means to be set at said high voltage when the voltage of the converted higher-voltage binary signal reaches a given voltage level,
   said disconnecting n-channel MOS transistor electrically isolating said gate means and said second input terminal of said inverting means from the high voltage applied at said first input terminal of said inverting means.

2. A circuit according to claim 1, wherein said gate means comprises an inverter.

3. A circuit according to claim 1, wherein said inverting means comprises: a p-channel MOS transistor having a source connected to the first reference terminal, a drain connected to said output terminal, and a gate connected to said first input terminal; and an n-channel MOS transistor having a drain connected to said output terminal, a source connected to a terminal to which a ground level voltage is applied, and a gate connected to said second input terminal.

* * * * *